United States Patent [19]
Yang

[11] Patent Number: 6,033,941
[45] Date of Patent: Mar. 7, 2000

[54] METHOD OF FORMING A THIN FILM TRANSISTOR WITH ASYMMETRICALLY ARRANGED GATE ELECTRODE AND OFFSET REGION

[75] Inventor: Hae Chang Yang, Chungcheongbuk-do, Rep. of Korea

[73] Assignee: LG Semicon Co., Ltd., Chungcheongbuk-Do, Rep. of Korea

[21] Appl. No.: 09/305,316

[22] Filed: May 5, 1999

Related U.S. Application Data

[62] Division of application No. 08/890,797, Jul. 11, 1997.

[30] Foreign Application Priority Data

Nov. 12, 1996 [KR] Rep. of Korea ............ 96-53431

[51] Int. Cl.[7] .................. H01L 29/76; H01L 31/036
[52] U.S. Cl. ............ 438/163; 257/66; 257/510; 257/57; 257/58; 257/61; 438/106; 438/151; 438/163; 438/175; 438/180
[58] Field of Search ..................... 438/151, 282, 438/270, 589, 163, 175, 180; 257/532, 516, 535, 347, 538, 379, 310, 66

[56] References Cited

U.S. PATENT DOCUMENTS

| | | | |
|---|---|---|---|
| 5,235,189 | 8/1993 | Hayden et al. | 257/329 |
| 5,340,754 | 8/1994 | Witek et al. | 437/32 |
| 5,393,681 | 2/1995 | Witek et al. | 437/40 |
| 5,508,531 | 4/1996 | Ha . | |
| 5,527,723 | 6/1996 | Witek et al. | 437/40 |
| 5,539,238 | 7/1996 | Malhi | 257/510 |
| 5,567,958 | 10/1996 | Orlowski et al. | 257/66 |
| 5,627,395 | 5/1997 | Witek et al. | 257/350 |
| 5,714,394 | 2/1998 | Kadosh et al. | 437/21 |
| 5,736,435 | 4/1998 | Venkatesan | 438/151 |
| 5,773,871 | 6/1998 | Boyd et al. . | |
| 5,869,847 | 2/1999 | Sin et al. | 257/66 |
| 5,925,894 | 7/1999 | Yang | 257/66 |
| 5,932,907 | 8/1999 | Grill et al. | 257/310 |

OTHER PUBLICATIONS

Van Zant, Peter, Microchip Fabrication Third Edition, pp.:496–500 and 518–520, 1997.
Wolf, Stanley, Silicon Processing for hte VLSI Era, vol. 1, pp.:365–369, 1986.
Wolf, Stanley "Silicon Processing for the VLSI Era, vol. 2 Process Integration" pp.:51–58, 1990.

*Primary Examiner*—Charles Bowers
*Assistant Examiner*—Laura Schillinger

[57] ABSTRACT

A thin film transistor which includes an oxide layer containing a trench; a semiconductor layer formed on the oxide layer, including the trench; a buffer layer formed on the semiconductor layer in the trench; a gate electrode aligned on the semiconductor layer on one side of the trench; and an impurity region formed in the semiconductor layer adjacent the gate electrode on one side of the trench, and an impurity region also formed in the semiconductor layer on the other side of the trench.

8 Claims, 5 Drawing Sheets

METHOD OF FORMING A THIN FILM TRANSISTOR WITH ASYMMETRICALLY ARRANGED GATE ELECTRODE AND OFFSET REGION

This application is a divisional of co-pending application Ser. No. 08/890,797, filed on Jul 11, 1997, the entire contents of which are hereby incorporated by reference.

BACKGROUND OF THE INVENTION

1. Field of the Invention

The present invention relates to a thin film transistor and more particularly, to the structure of a thin film transistor which guarantees a stable off-set region. The present invention is also directed to the method of fabricating the thin film transistor.

2. Discussion of Related Art

In general, a thin film transistor (TFT) is used for an SRAM device having over 1M bytes of storage capacity, instead of a PMOS load transistor or a load resistor, and is also widely used in a switching device for switching an image data signal of each image region in a liquid crystal display. Specifically, if an off current of the PMOS transistor is reduced and its on current is increased in the SRAM cell employing the PMOS TFT as the load transistor, the consumed power of the SRAM cell is decreased and its memory characteristic is enhanced, thereby producing a high quality SRAM cell. Therefore, research on enhancing the on/off current ratio has been actively progressed in recent years.

With reference to the attached drawings, the fabricating procedures of a conventional TFT for enhancing its on/off current ratio will be described below.

As illustrated in FIGS. 1a through 1d, the conventional TFT is fabricated to have a large-sized grain using a solid phase epitaxy (SPE) method of a polysilicon body on the basis of a bottom gate. The SPE method performs a heat treatment at 600° C. for 24 hours. That is, as illustrated in FIG. 1a, polysilicon is deposited on an insulating substrate 1 or insulating layer or silicon substrate, and patterned by photolithography using a gate mask, thereby forming a gate electrode 2. As illustrated in FIG. 1b, a gate oxide layer 3 is deposited over the surface of the substrate by chemical vapor deposition (CVD) or by thermal oxidation. A polysilicon body layer 4 is successively deposited on the gate oxide layer 3 by CVD. Then the SPE method is performed at 600° C. for 24 hours to enlarge the size of the polysilicon body grain 4. As illustrated in FIG. 1c, a photoresist layer 5 is deposited on the polysilicon body layer 4 and its channel region is masked by an exposing and developing process. Here, the channel is masked in a manner such that the source region 6a overlaps with the gate electrode 2, and the drain region 6b is off-set with respect to the gate electrode 2. As illustrated in FIG. 1d, a P-type ion impurity, namely, a boron ion is implanted in the exposed polysilicon body layer 4 in the case of the PMOS transistor, and an N-type impurity ion, namely, phosphorus ion or Arsenic ion is implanted thereinto in the case of the NMOS transistor to form a source/drain region. In FIG. 1d, reference character "a" is the source region, reference character "b" is a channel region, reference character "c" is the off set region, and reference character "d" is the drain region.

However, the thus-structured conventional TFT has the following problems:

First, as the photo mask process defines the channel region together with the off set region, it is too complicated to implement the process. In addition, since the variation of the off current is serious, according to the alignment, the reliability of the TFT is decreased.

Second, since the length of the channel off set region of the TFT affects the cell's size, it causes difficulty in integration.

SUMMARY OF THE INVENTION

Accordingly, the present invention is directed to a thin film transistor and its fabrication method that substantially obviates one or more of the problems due to limitations and disadvantages of the related art.

Accordingly, an object of the present invention is to provide a thin film transistor which guarantees an off-set region using a self aligning method, thereby simplifying the process and providing a TFT with stable characteristics.

Other objects and further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

To achieve these and other advantages and in accordance with the purpose of the present invention, as embodied and broadly described, a thin film transistor as defined by the present invention, includes:

an oxide layer containing a trench;

a semiconductor layer formed on the oxide layer including the trench;

a buffer layer formed on the semiconductor layer in the trench;

a gate electrode positioned on the semiconductor layer on one side of the trench; and an impurity region formed in the semiconductor layer adjacent the gate electrode on one side of the trench, and an impurity region also formed in the semiconductor layer on the other side of the trench.

The fabrication method of the present invention includes the steps of:

forming a trench in an oxide layer;

forming a semiconductor layer on the oxide layer including the trench;

forming a buffer layer on the semiconductor layer in the trench;

forming a gate electrode on the semiconductor layer on one side of the trench; and forming impurity regions in the semiconductor layer adjacent the gate electrode on one side of the trench, and an impurity region also formed in the semiconductor layer on the other side of the trench.

It is to be understood that both the foregoing general description and the following detailed description are exemplary and explanatory and are intended to provide further explanation of the present invention as claimed.

BRIEF DESCRIPTION OF THE ATTACHED DRAWINGS

The present invention will become more fully understood from the detailed description given hereinbelow and the accompanying drawings which are given by way of illustration only, and thus, are not limitative of the present invention, and wherein.

DETAILED DESCRIPTION OF PREFERRED EMBODIMENT

Figure 1A:
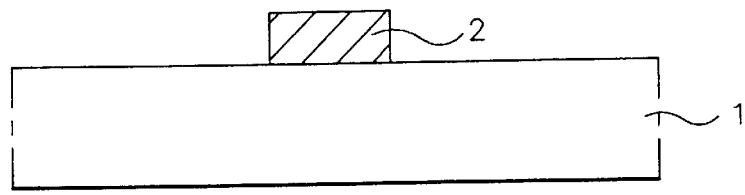
FIGS. 1a through 1d are sectional views illustrating the fabricating procedures of a conventional thin film transistor.
Figure 1B:
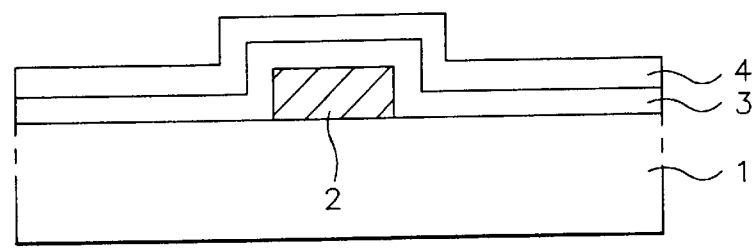
Figure 1C:
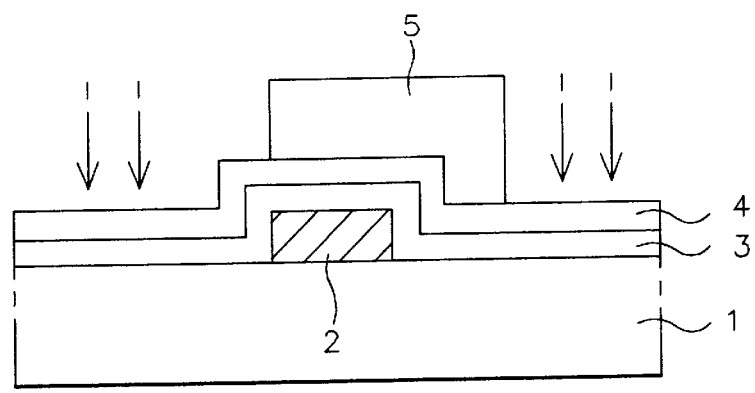
Figure 1D:
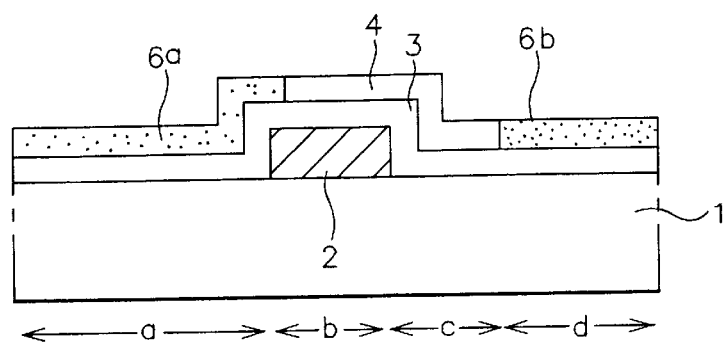
Figure 2:
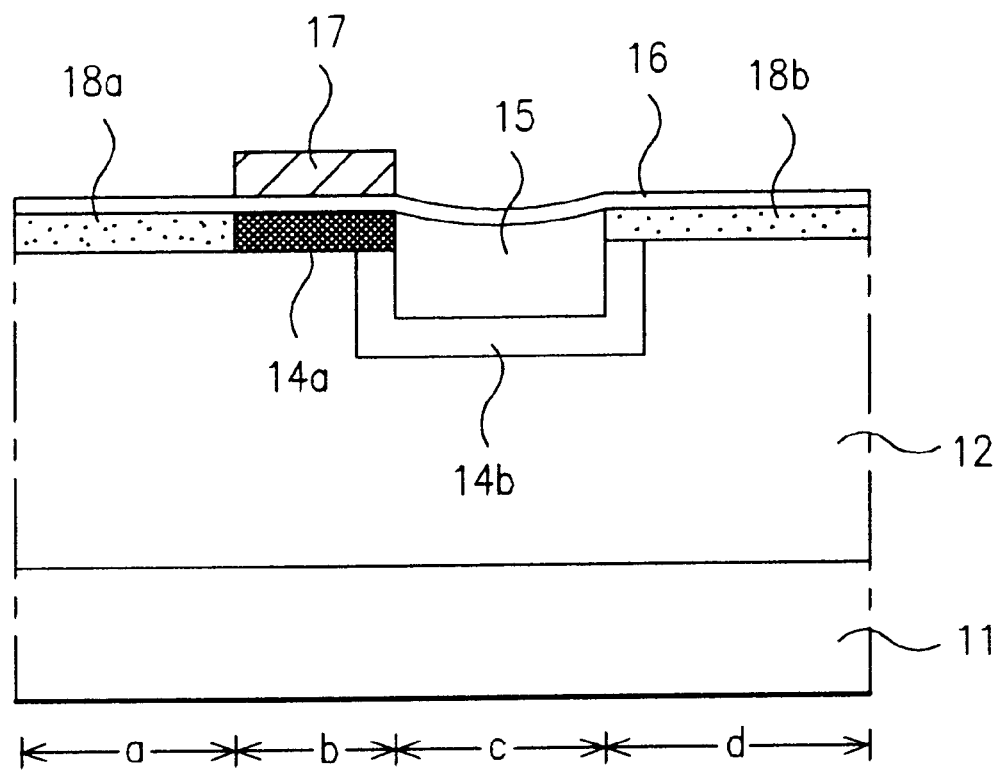
FIG. 2 is a sectional view of the thin film transistor of the present invention.

Reference will now be made in detail to the preferred embodiments of the present invention, examples of which are illustrated in the accompanying drawings.

Presently, a suitable length of the off-set of a thin film transistor is 0.5 µm. The thin film transistor of the present invention can have a desired off-set length by the self aligning method.

As illustrated in FIGS. 2 and 3a through 3h, a top gate structure of the present invention is formed in a manner such that an initial oxide layer 12, e.g. silicon dioxide or a nitride layer, e.g. silicon nitride ($Si_3N_4$), is formed on an insulating substrate 11 or a silicon substrate, to have a predetermined thickness. A trench having a predetermined thickness is formed in a predetermined region of the initial oxide layer 12 so as to be isolated from the substrate 11. A polysilicon body layer 14 (referring to FIG. 3c) is formed on the initial oxide layer 12 including the trench. A buffer oxide layer 15, e.g. silicon dioxide or a nitride layer, e.g silicon nitride is deposited in the trench. A gate oxide layer 16, e.g. silicon dioxide is deposited on or grown out of the polysilicon body layer 14 and the initial oxide layer 15. A gate electrode 17, e.g. a metal such as aluminum, is formed on the gate oxide layer 16 of the polysilicon body layer on one side of the trench. A source region 18a is formed in the polysilicon body layer 14 beside the gate electrode 17. A drain region 18b is formed in the polysilicon body layer 14 at the other side of the trench. An off-set region 14b is formed in the polysilicon body layer 14 in the trench. A channel region 14a is formed in the polysilicon body layer 14 under the gate electrode 17.

A nitride layer, e.g. $Si_3N_4$ can be formed on the substrate 11 instead of the initial oxide layer 12. Similarly, the nitride layer can be used instead of the buffer oxide layer 15.

Figure 3A:
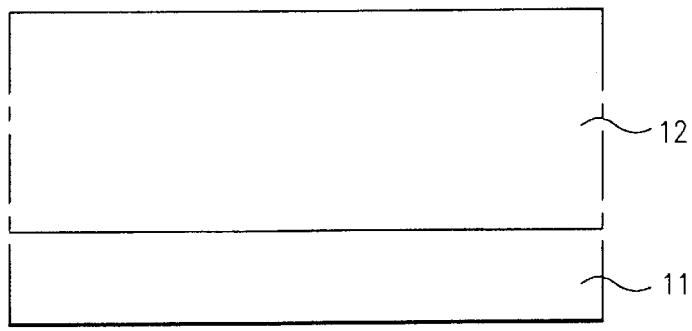
FIGS. 3a through 3h are sectional views illustrating the fabricating procedures of the present invention.

As illustrated in FIG. 3a, in the fabrication method of the TFT of the present invention, the initial oxide layer 12 is deposited on the insulating substrate 11 or silicon substrate by chemical vapor deposition or thermal oxidation.

Figure 3B:
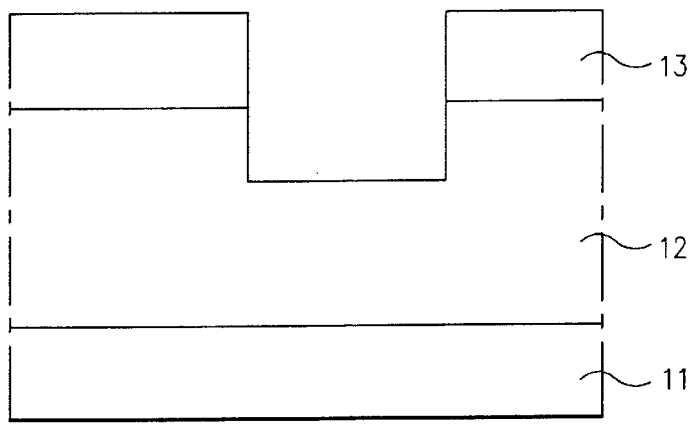

As illustrated in FIG. 3b, a photoresist layer 13 is deposited on the overall surface of the substrate and selectively patterned to form the trench at a predetermined region of the initial oxide layer 12, utilizing an exposing and developing process. The initial oxide layer 12 exposed by using the patterned photoresist layer as a mask is dry etched to be as thick as the substrate 11. Thus, the trench is formed.

Figure 3C:
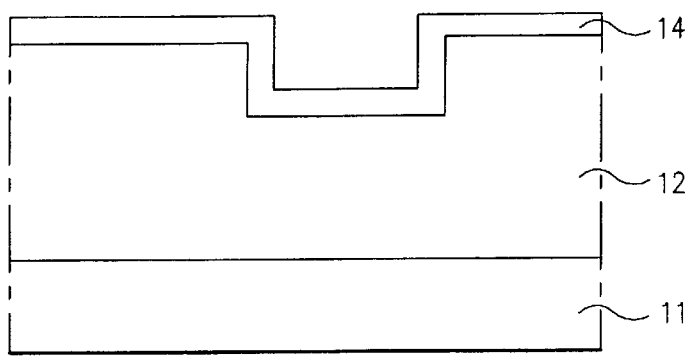

As illustrated in FIG. 3c, the photoresist layer 13 is removed. Polysilicon is deposited on the patterned initial oxide layer 12 using CVD to form the polysilicon body layer 14. Therefore, the polysilicon body layer 14 becomes an active layer of the TFT. Instead of the polysilicon, an amorphous silicon which is doped and heat-treated can be used.

Figure 3D:
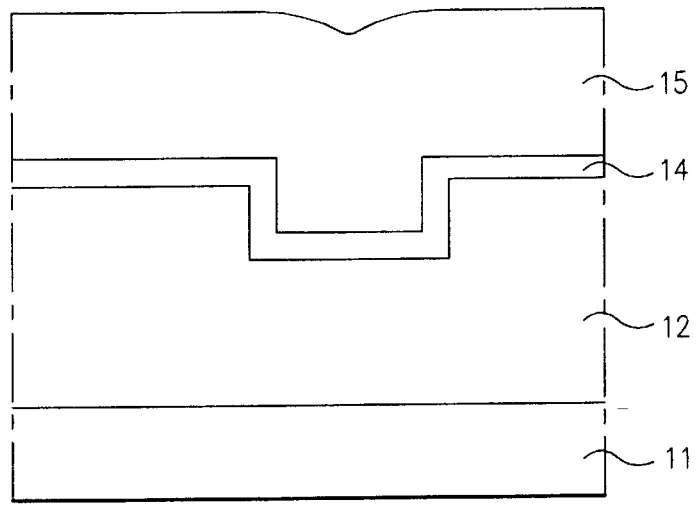

As illustrated in FIG. 3d, a buffer oxide layer 15 for buffering the trench is formed on the polysilicon body layer 14, using CVD. Here, a buffer nitride layer 15, e.g. $Si_3N_4$, can be known in place of the buffer oxide layer.

Figure 3E:
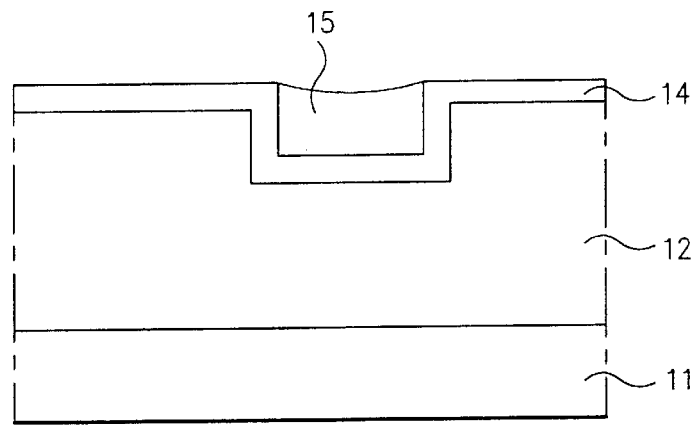

As illustrated in FIG. 3e, the buffer oxide layer 15 is removed in a geometrical ratio, using the etch back or chemical mechanical polishing method, so that the remaining buffer oxide layer 15 is left only in the trench.

Figure 3F:
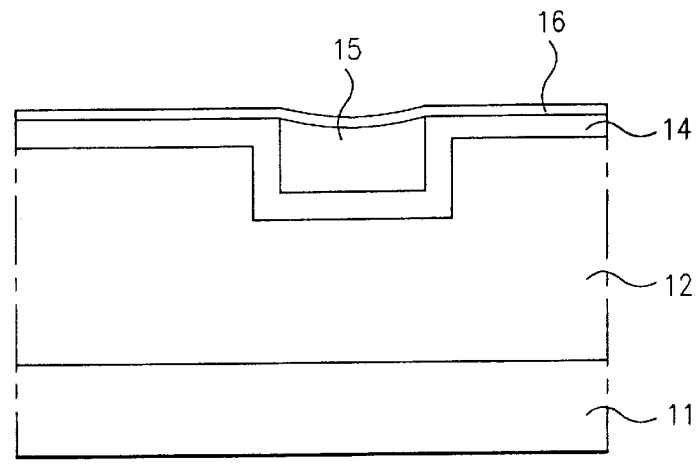

As illustrated in FIG. 3f, the gate oxide layer 16 is deposited on the polysilicon body layer 14 and the buffer oxide layer 15, using CVD or the thermal oxidation method.

Figure 3G:
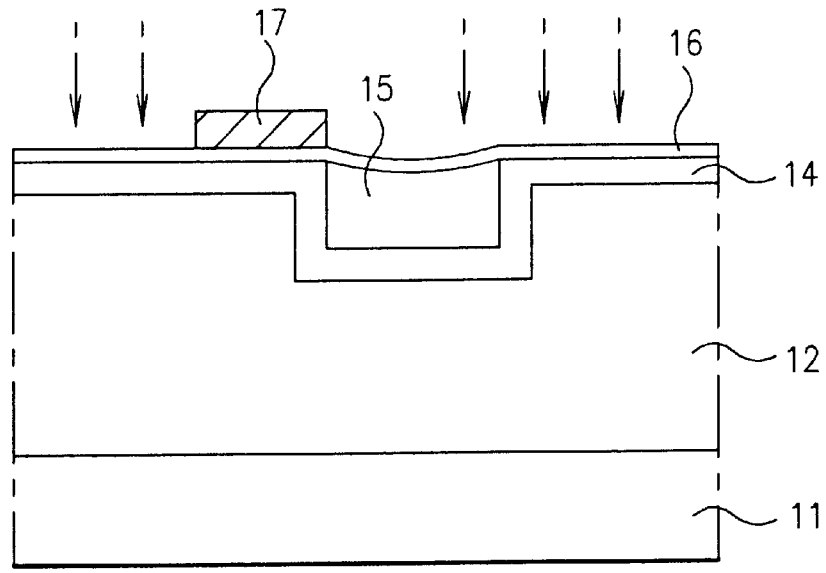

As illustrated in FIG. 3g, the material for the gate electrode is deposited on the overall surface of the substrate using CVD, and photo etched, using a gate forming mask. The gate electrode 17 is formed and aligned on one side of the trench. Here, instead of polysilicon, a metal layer, e.g. aluminum, is deposited to form the gate electrode 17. Then a P-type impurity ion such as $BF_2$ (boron) is implanted in the case of a PMOS, or an N-type impurity ion such as phosphorus ion or Arsenic ion is implanted in the case of an NMOS, using the gate electrode 17 formed on one side of the trench as a mask.

Figure 3H:
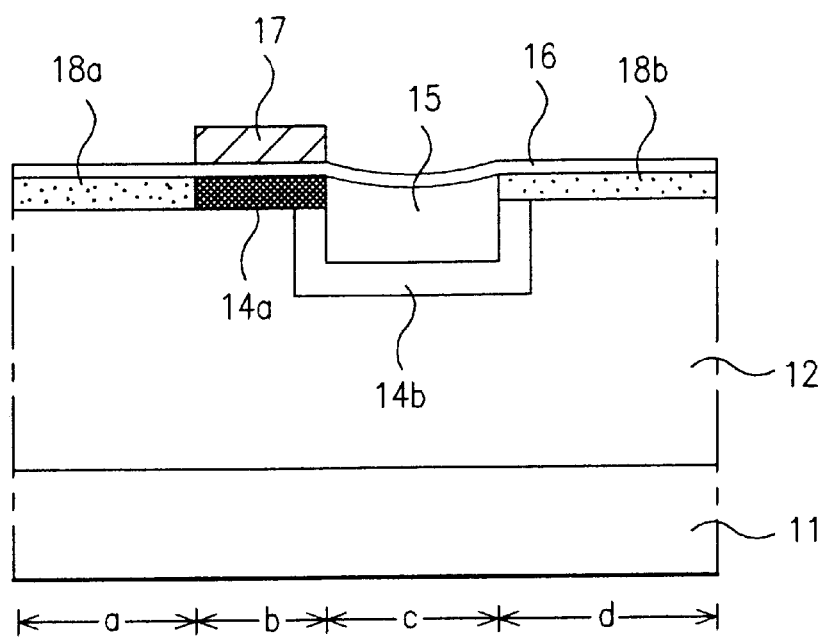

As illustrated in FIG. 3h, the source region 18a containing an impurity ion implanted therein is formed in the polysilicon body layer 14 on one side of the gate electrode 17 which in turn is formed on one side of the trench, and the drain region 18b containing an impurity ion implanted therein is formed on the polysilicon body layer 14 on the other side of the trench. Accordingly, the channel region 14a, which is formed under the gate electrode 17, does not contain an ion impurity. As the polysilicon body layer 14 formed in the trench also does not contain an ion impurity because of the buffer oxide layer 15, the polysilicon 14 forms the gate electrode 17 and the off-set region 14b. Here, reference character "a" is the source region; reference character "b" is the channel region; reference character "c" is the off-set region; and reference character "d" is the drain region.

The thus-fabricated TFT can guarantee the length of the off-set region of 0.5 µm, so that the TFT has a stable on/off current characteristic.

The invention also has the following effects:

First, the invention needs no additional off-set mask in defining the off-set region, so that the process requirements are reduced, thereby enhancing productivity.

Second, as the invention can fully guarantee an offset region by using the self-aligning method, a highly reliable device having stable on/off current characteristics is fabricated.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A fabrication method of a thin film transistor, comprising the steps of:

forming a trench in an oxide layer;

forming a semiconductor layer on the oxide layer including the trench;

forming a buffer layer on the semiconductor layer in the trench;

forming a gate electrode on the semiconductor layer on one side of the trench; and forming impurity regions in the semiconductor layer adjacent the gate electrode on one side of the trench, and an impurity region also formed in the semiconductor layer on the other side of the trench, said gate electrode self-aligning a channel region, free of impurities, formed below said gate electrode.

2. The method as claimed in claim 1, wherein the oxide layer is disposed on a substrate whereby the trench is isolated from the substrate.

3. The method as claimed in claim 1, wherein the semiconductor layer is polysilicon or amorphous silicon.

4. The method as claimed in claim 1 wherein a gate oxide layer is formed on the semiconductor layer and the buffer layer.

5. The method as claimed in claim 1, wherein the buffer layer in the trench is an oxide layer or a nitride layer.

6. The method as claimed in claim 1, wherein the buffer layer in the trench is formed after the buffer layer is deposited over the entire surface of the substrate, using etch back and chemical mechanical polishing techniques.

7. The method as claimed in claim 1, wherein the buffer layer formed on the semiconductor layer in the trench is used as a mask when forming the impurity regions.

8. The method as claimed in claim 1, wherein the semiconductor layer in the trench is used for an off-set region.

* * * * *